Oct. 24, 1950 W. J. O'BRIEN 2,527,441

AUTOMATIC VOLUME CONTROL CIRCUITS

Filed Aug. 27, 1945

INVENTOR.
WILLIAM J. O'BRIEN,
BY [signature]
ATTORNEY.

Patented Oct. 24, 1950

2,527,441

UNITED STATES PATENT OFFICE 2,527,441

AUTOMATIC VOLUME CONTROL CIRCUIT

William J. O'Brien, London, England, assignor to The Decca Record Company, Limited, London, England, a corporation of Great Britain Application August 27, 1945, Serial No. 612,992

12 Claims. (Cl. 179—171)

Figures 1, 2:
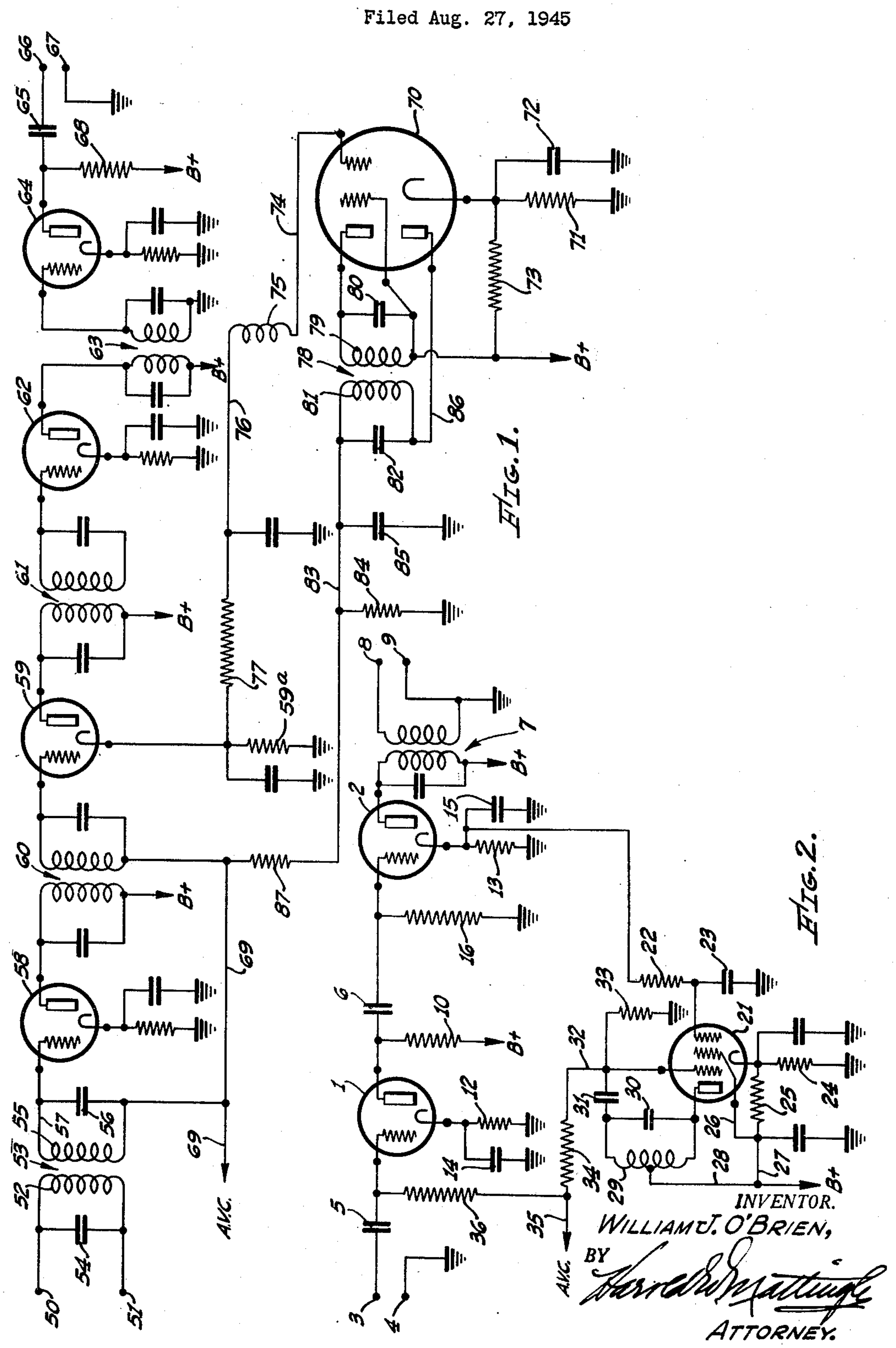

My invention relates to automatic volume control circuits and has particular reference to automatic volume control circuits having an unusually wide operating range with high precision of control.

The automatic volume control circuits used in radio receivers and like electronic devices make use of a change in the amplitude of the received signal to effect a compensating change in the gain of the preceding amplifier stages. Such a system requires a change in the output signal to produce the correcting voltage which is used to control the gain of the amplifiers. Accordingly large changes in the amplitude of th received signal produce substantial changes in the amplitude of the output signal. This is undesirable as it is the office of the automatic volume control circuit to maintain a constant output level..

The automatic volume control circuits used prior to my invention are unsatisfactory for radio frequency control circuits which require a constant amplitude of output signal and a rapid response to changes in input signal strength, the present circuits operating to produce substantial changes in the output level with large changes in input signal and also having a relatively slow response as is required to prevent demodulation of an unmodulated radio frequency signal.

It is, therefore, an object of my invention to provide an automatic volume control circuit which overcomes the above noted disadvantages by providing a constant output level substantially independent of the amplitude of the input signal.

It is also an object of my invention to provide a circuit of the character set forth in the preceding paragraph which is extremely rapid in response to changes in the amplitude of the input signal.

It is an additional object of my invention to provide an automatic volume control circuit in which a correcting voltage for controlling the gain of preceding amplifier stages is obtained from an oscillator, the output amplitude of which is controlled by the amplitude of the output signal.

It is a still further object of my invention to provide an automatic volume control circuit of the character set forth in the preceding paragraph in which a regulating voltage for controlling the gain of the preceding amplifier stages is derived from the rectified output of a control mechanism which is coupled to the output signal and the amplification of which is controlled by the level of the output signal.

Other objects and advantages of my invention will be apparent from a study of the following specifications, read in connection with the accompanying drawings, wherein:

Fig. 1 is a schematic wiring diagram illustrating one form of automatic volume control circuit of my invention; and Figure 2 is a schematic wiring diagram illustrating a modified form of the invention.

In the drawings conventional symbols have been employed for representing the various electrical components. The cathode heaters and the circuits for energizing the cathode heaters have been omitted from both figures as these circuits are conventional and well known in the art. Similarly the source of positive potential for energizing the plates or anodes of the vacuum tubes has been omitted and connection to a suitable conventional source well known in the art has been indicated by an arrow bearing the legend B+. In both figures, a conductor extending to the left and terminating in an arrowhead designated AVC is intended to represent an automatic volume control bus which may be connected to control the gain of the preceding amplifier stages by a connection identical with that employed in the first vacuum tube shown on each figure. Since these matters are conventional and well known in the art, it is not considered necessary to illustrate in detail all of the preceding amplifier circuits that may be used.

Referring to Fig. 1, I have illustrated therein one form of the invention as including signal input terminals 50 and 51 which are connected to a primary winding 52 of a coupling transformer 53. The winding 52 is preferably tuned as by a condenser 54. The transformer 53 includes a secondary winding 55 which is shunted by a tuning condenser 56 and which is connected as by a conductor 57 to the grid of a vacuum tube 58.

The plate of the vacuum tube 58 is coupled to the grid of a vacuum tube 59 through a tuned coupling transformer 60 identical to the transformer 53 just described. Similarly, the plate of the tube 59 is coupled through a transformer 61 to the grid of a tube 62, the plate of which is coupled through a transformer 63 to the grid of an output tube 64. The plate of the output tube 64 may be coupled through a coupling condenser 65 to an output terminal 66, an output terminal 67 of opposite polarity being connected to ground.

Plate load for the tube 64 may comprise a resistance 68 connected between the plate of the tube 64 and a suitable source of plate supply potential. Similarly, the plates of each of the tubes 58, 59 and 62 are connected through the primary windings of the transformers 60, 61 and 63, respectively, to a suitable source of plate supply potential. The cathodes of each of the tubes 68, 62 and 64 are connected to ground in the conventional manner through cathode biasing resistances which are shunted by by-pass condensers.

The tube 59 is intended to comprise the frequency change stage of the small angle plate current flow type, and to this end includes a cathode resistance 59a having a very high resistance as compared with the ohmic value of the other cathode resistors.

The grids of the tubes 62 and 64 are returned to ground as by connecting the secondary windings of the transformers 61 and 63 to ground. The grids of the tubes 58 and 59 are connected through the secondary windings of transformers 53 and 60 to an automatic volume control bus 69 upon which is impressed, by means of a circuit to be described in the ensuing paragraphs, a negative potential so adjusted to maintain substantially constant the amplitude of the output signal impressed across the terminals 66 and 67.

The circuit for developing the direct potential on the AVC bus 69 includes a dual purpose amplifier tube 70 of the diode-tetrode type. This tube is shown in Fig. 1 as comprising a tetrode section which includes a control grid, a screen grid and a plate, and a diode section which includes a diode plate, all of these elements cooperating with a single cathode. The cathode of the tube 70 is connected to ground through a resistance 71 which is by-passed as by a condenser 72. The tube 70 is normally biased beyond cut off by applying to the cathode a positive delay potential sufficient to normally prevent the flow of plate current in the tube. This is accomplished by connecting the cathode of the tube 70 to a suitable source of high voltage direct current through a resistance 73.

The grid circuit for the tube 70 includes a conductor 74 connected between the grid of the tube 70 and one terminal of a pick-up coil 75 inductively coupled to the primary winding of the transformer 63. The other terminal of the pick-up coil 75 is connected through conductors 76 and resistance 77 to the cathode of the tube 59. This grid circuit serves to apply to the grid of the tube 70 a positive direct potential equal to the potential of the cathode of the tube 59 with respect to ground and serves also to apply to the grid of the tube 70 a radio frequency signal which is induced in the pick-up coil 75 by the transformer 63. The radio frequency signal which is applied to the grid of the tube 70 is amplified thereby and impressed upon an output coupling transformer 78 which includes a primary winding 79 shunted by a condenser 80 and connected at one end to the plate of the tube 70 and at the other end to the source of plate supply potential.

The screen grid of the tube 70 may be likewise connected directly to the source of plate supply potential. The transformer 78 includes a secondary winding 81 which is shunted by a condenser 82. One terminal of the winding 81 is connected to a conductor 83 which is in turn connected to ground through a load resistance 84 and a by-pass condenser 85. The other terminal of the secondary winding 81 is connected as by means of a conductor 86 to the diode plate of the tube 70. These windings 79 and 81 are each tuned to the frequency of the signals amplified by the amplifier tubes 62 and 64. The conductor 83 is coupled to the AVC bus 69 through a coupling resistance 87.

The operation of the above described circuit depends upon cascading the delays imposed upon the amplifier section of the tube 70 and also upon the rectifier section of this tube, and takes advantage of the variable gain of the amplifier section and the variation in the input signal of the amplifier section with changes in the output level. The control grid of the tube 70 is (in the absence of an input signal) near ground potential, whereas the divider comprising resistances 71 and 73 maintains the cathode of the tube 70 at a substantial positive potential with respect to ground sufficient to bias the tube 70 beyond cut-off. The tube 70 will therefore be inoperative as an amplifier until the magnitude of the input signal of the amplifier rises to a value sufficient to cause the drop in resistance 59a to become sufficiently large to reduce the bias on the tube 70 to b below the blocking bias. Further increases in signal level therefore shifts the grid of the tube 70 in the positive direction to increase the amplification of the tube.

Since the diode plate of the tube 70 is normally at ground potential, the same delay voltage is applied to that rectifier section so that the rectifier section is blocked until the output signal developed across the winding 81 rises to a peak value exceeding the rectifier delay voltage. Thereafter a small increase in input signal to the amplifier will produce a large change in the negative voltage developed on the AVC bus 69. This is for the reason that the positive voltage across resistance 59a increases, the signal voltage induced in the winding 75 increases, the gain of the amplifying section of the tube 70 increases, and the output signal applied to the rectifier increases. All of these changes are in the same direction and have a product relation to each other with the result that very large changes in AVC bus voltage result from minute changes in the output level of the amplifier. I have found that an input signal change in the order of one hundred thousand to one will produce an output signal change of only about ten percent.

Referring to Fig. 2, I have illustrated a modified form of the invention as comprising a resistance coupled amplifier including two vacuum tube amplifiers 1 and 2.. The input signal to be amplified is applied to input terminals 3 and 4. The terminal 4 is grounded and the terminal 3 is connected to the grid of the tube 1 through a coupling condenser 5. The plate of the tube 1 is coupled through a coupling condenser 6 to the grid of the tube 2 and the plate of the tube 2 is connected through a tuned coupling transformer 7 to output terminals 8 and 9.

Plate load for the tube 1 may comprise a resistance 10 connected to the plate of the tube and to a suitable source of direct current plate supply. The cathodes of each of tubes 1 and 2 are connected to ground through cathode biasing resistors 12 and 13 which are each by-passed by condensers 14 and 15 connected in parallel therewith. The grid of the tube 2 is returned to ground through a grid resistance 16.

The tube 2 is intended to comprise a high self biased tube or frequency changing stage, and to this end the cathode resistance 13 is made very large compared with the resistances in the other cathode circuits.

As the input signal to the amplifier is increased there is developed across the resistance 13 a correspondingly increasing voltage. This voltage is applied to the grid of an oscillator tube 21 shown in Fig. 2 as comprising a vacuum tube of the pentode type, including a control grid, a suppressor grid, a screen grid, a plate and a cathode. To this end a coupling resistance 22 is connected in series in conductor 17 between the grid of the tube 21 and the cathode of the frequency changer tube 2.

The grid of the tube 21 is by-passed to ground through a condenser 23. The tube 21 is normally biased beyond cut-off so that in the absence of a signal on the grid of the tube 2, the tube 21 will drawn no plate current. This biasing is obtained by connecting the cathode of the tube 21 to ground through a resistance 24 and to a suitable source of plate supply potential through a resistance 25, the resistances 24 and 25 being chosen to apply to the cathode of the tube 21 a positive direct delay potential with respect to ground sufficient to prevent the flow of plate current, it being recalled that in the absence of a signal on the grid of the tube 2, the grid of the tube 21 is substantially at ground potential, by virtue of its connection to ground through resistances 22 and 13.

The screen grid of the tube 21 is connected through conductors 26 and 27 to the source of plate supply potential, which source is also connected as by means of a conductor 28 to the mid-point of a tuning inductance 29. The tuning inductance 29 is shunted by a tuning condenser 30. One end of the inductance 29 is connected to the plate of the tube 21 and the other end of the inductance 29 is connected through a coupling condenser 31 to a conductor 32 which is in turn connected to the suppressor grid of the tube 21 and also to ground through a resistance 33.

The conductor 32 is also connected through a resistance 34 to an automatic volume control bus 35. The grid of the amplifier tube 1 is connected to the AVC bus 35 through a grid resistance 36. A similar conection to the bus 35 is employed for any amplifier tubes which may precede the amplifier tube 1 and whose output is impressed across the terminals 3 and 4, it being understood that in general two or more controlled amplifier stages are required to obtain a satisfactory range of automatic volume control.

The operation of the circuit just described is as follows:

A radio frequency input signal impresed across the terminals 3 and 4 is amplified by the tube 1 and applied to the grid of the tube 2. This produces in the resistance 13 a direct potential which varies with changes in the amplitude of the signal which is applied to the grid of the tube 2. This voltage being applied to the grid of the tube 21 reduces the negative bias on the tube 21. As the amplitude of the received signal increases, the voltage developed across the resistance 13 increases and the bias on the oscillator tube 21 correspondingly decreases. When the bias decreases to a certain critical value, the tube 21 beings to oscillate as a suppressor grid oscillator and at a frequency determined by the inductance of the coil 29 and the capacity of the condenser 30.

As soon as the tube 21 beings to oscillate, there is developed on the suppressor grid and on the conductor 32 a negative direct potential due to the condenser 31 and the resistance 33, the tube acting in a manner analogous to a grid leak detector circuit. The magnitude of this direct potential is determined by the amplitude of the oscillating potential produced by the tube 21, and this in turn is critically dependent upon the grid bias of the tube. The negative voltage which is developed on the conductor 32 is applied to the grid of the amplifier tube 1 and any tubes preceding to reduce the gain of those tubes and correspondingly reduces the amplitude of the signal applied to the grid of the tube 2. Since the amplitude of the oscillations is generated by the tube 21 are critically dependent upon the grid bias of that tube and therefore upon the magnitude of the voltage developed across resistance 13, it is seen that an extremely small change in the magnitude of the signal applied to the grid of the tube 2 is effective in producing a very large change in the magnitude of the direct potential applied to the AVC bus 35.

I have, in the foregoing, illustrated and described two embodiments of my invention and attention is directed particularly to the fact that in both of the embodiments of the invention the AVC voltage is derived by the rectification of a radio frequency signal, the amplitude of which is, by virtue of the novel circuit arrangement, made critically dependent upon the magnitude of the output signal. This provides for great sensitivity and for an extremely wide control range.

In the form of the invention shown in Fig. 2, the radio frequency signal is developed by a suppressor grid oscillator, whereas in the form of the invention which is shown in Fig. 1, the radio frequency signal is developed in a high gain amplifier stage which is suitably coupled to the output of the controlled amplifier. In both modifications two separate delay circuits have been arranged in cascade so that an appreciable input signal is required before the AVC system begins to operate. This coupled with the variable gain and input signal features of the electronic stages used in the AVC circuits proper, provide for extremely high sensitivity and very good regulations.

While I have shown and described the preferred embodiment of my invention, I do not desire to be limited to any of the details of construction shown or described herein, except as defined in the appended claims.

I claim:

1. In an automatic volume control circuit for use with a radio frequency vacuum tube amplifier having a gain control grid circuit and including a frequency changing stage, the combination of: a suppressor grid oscillator including a pentode type of vacuum tube and a self-oscillating circuit connected between the plate and suppressor grid of said vacuum tube; means connecting the control grid of said vacuum tube to the cathode of said frequency changing stage; and means connecting the suppressor grid of said vacuum tube to said gain control grid circuit.

2. In an automatic volume control circuit for controlling the gain of a thermionic amplifier to maintain a substantially constant output level despite variations in input level by varying the grid bias of the thermionic tubes of said amplifier, the combination of: a frequency changing vacuum tube in said amplifier having a cathode connected in a cathode circuit including a resistance sufficiently high to normally bias the tube nearly to cut off and produce a non-linear grid voltage-plate current characteristic; a variable gain vacuum tube for producing an output signal varying in magnitude in accordance with variations in gain, said variable gain tube having a grid and a cathode; means for applying to the cathode of said variable gain tube a positive biasing potential for normally biasing said tube beyond cutoff; means connecting the grid of said variable gain tube to the cathode of said frequency changing tube for applying to said grid a positive potential proportional to the positive potential developed across said resistance to thereby control the operation of said variable gain tube and vary the gain thereof in accordance with variations in said positive potential; rectifier means for rectifying said output signal; and a control circuit connecting said rectifier to the grids of the thermionic tubes in said amplifier preceding said frequency changing tube, said control circuit being arranged to apply to said grids the negative polarity of the rectified output signal.

3. In an automatic volume control circuit for controlling the gain of a thermionic amplifier to maintain a substantially constant output level by varying the grid bias of the thermionic tubes of said amplifier, the combination of: a source of radio frequency voltage of a frequency different from that amplified by said amplifier; amplifying means for amplifying said voltage; means coupled to said thermionic amplifier for regulating the gain of said amplifying means in accordance with the output level of said amplifier; a rectifier for rectifying the output of said amplifying means to produce a direct control potential of negative polarity; and a control circuit connecting said rectifier to the grids of the thermionic tubes in said amplifier to apply said direct control potential thereto as a grid bias voltage.

4. In an automatic volume control circuit for controlling the gain of a thermionic amplifier to maintain a substantially constant output level by varying the grid bias of the thermionic tubes of said amplifier, the combination of: a radio frequency oscillator; means coupled to said amplifier for regulating the output level of said oscillator in accordance with the output level of said amplifier; a rectifier for rectifying the output of said oscillator to produce a direct control potential of negative polarity; and a control circuit connecting said rectifier to the grids of the thermionic tubes in said amplifier to apply said direct control potential thereto as a grid bias voltage.

5. In an automatic volume control circuit for controlling the gain of a radio frequency amplifier to maintain a substantially constant output level by varying the grid bias of the thermionic tubes of said amplifier, the combination of: an amplifying means; a coupling circuit connecting the input of said amplifying means to the output of said radio frequency amplifier; means coupled to said radio frequency amplifier for regulating the gain of said amplifying means in accordance with the output level of said amplifier; a rectifier for rectifying the output of said amplifying means to produce a direct control potential of negative polarity; and a control circuit connecting said rectifier to the grids of the amplifier tubes in said amplifier to apply said direct control potential thereto as a grid bias voltage.

6. In an automatic volume control circuit for an amplifier, the combination of: a variable gain vacuum tube stage for producing an output signal varying in magnitude in accordance with variations in gain of said stage; a control circuit interconnecting said amplifier with said stage for holding said stage inoperative until the input voltage to said amplifier rises to a predetermined value and for thereafter varying the gain of said amplifier in accordance with variations in output voltage of said amplifiers; a rectifier connected to rectify said output signal to produce a direct control potential of negative polarity; means rendering said rectifier inoperative until said output signal rises to a predetermined value; and a control circuit connecting said rectifier to the grids of the amplifier tubes in said amplifier to apply said direct control potential thereto as a grid bias voltage.

7. In an automatic volume control circuit for an amplifier, the combination of: means for producing a direct potential varying in accordance with variations in the amplitude of the output of said amplifier; a vacuum tube radio frequency oscillator; a gain control circuit connecting said direct potential to the grid of said vacuum tube radio frequency oscillator; a rectifier for rectifying the output of said oscillator to produce a direct control potential of negative polarity; and a control circuit connecting said rectifier to the grids of the tubes in said amplifier to apply said direct control potential thereto as a grid bias voltage.

8. In an automatic volume control circuit for an amplifier, the combination of: means for producing a direct potential varying in accordance with variations in the amplitude of the output of said amplifier; a vacuum tube amplifying means; means coupling the input of said amplifying means to the output of said amplifier; a gain control circuit connecting said direct potential to the grid of said vacuum tube amplifying means; a rectifier for rectifying the output of said amplifying means; a load resistance connected in circuit with said rectifier for producing a direct control potential of negative polarity; and a control circuit connecting said load resistance to the grids of the tubes in said amplifier to apply said direct control potential thereto as a grid bias voltage.

9. In an automatic volume control circuit for controlling the gain of a radio frequency amplifier to maintain a substantially constant output level by varying the grid bias of the thermionic tubes of said amplifier, the combination of: an amplifying means; a coupling circuit connecting the input of said amplifying means to the output of said radio frequency amplifier; means for applying to said amplifying means a delay voltage for preventing operation of said amplifying means until said output level rises to a predetermined value; means coupled to said radio frequency amplifier for regulating the gain of said amplifying means in accordance with the output level of said amplifier; a rectifier for rectifying the output of said amplifying means; a load resistance connected in circuit with said rectifier for producing a direct control potential of negative polarity; means for applying to said rectifier a delay voltage for preventing operation of said rectifier until the output of said amplifying means rises to a predetermined value; and a control circuit connecting said load resistance to the grids of the thermionic tubes in said amplifier to apply said direct control potential thereto as a grid bias voltage.

10. In an automatic volume control circuit for controlling the gain of a thermionic amplifier to maintain a substantially constant output level by varying the grid bias of the thermionic tubes of said amplifier, the combination of: a variable gain vacuum tube stage for producing an output signal varying in magnitude in accordance with variations in gain of said stage; means coupled to said thermionic amplifier for regulating the gain of said stage in accordance with the output level of said amplifier; a rectifier for rectifying said output signal; a load resistance connected in circuit with said rectifier for producing a direct control potential of negative polarity; and a control circuit connecting said load resistance to the grids of the thermionic tubes in said amplifier to apply said direct control potential thereto as a grid bias voltage.

11. In an automatic volume control circuit for controlling the gain of a thermionic amplifier to maintain a substantially constant output level by varying the grid bias of the thermionic tubes of said amplifier, the combination of: a variable gain vacuum tube stage for producing an output signal of a frequency different from that amplified by said amplifier and varying in magnitude in accordance with variations in gain of said stage; means coupled to said thermionic amplifier for regulating the gain of said stage in accordance with the output level of said amplifier; a rectifier for rectifying said output signal; a load resistance connected in circuit with said rectifier for producing a direct control potential of negative polarity; and a control circuit connecting said load resistance to the grids of the thermionic tubes in said amplifier to apply said direct control potential thereto as a grid bias voltage.

12. In an automatic volume control circuit for controlling the gain of a thermionic amplifier to maintain a substantially constant output level by varying the grid bias of the thermionic tubes of said amplifier, the combination of: a variable gain vacuum tube stage for producing an output signal varying in magnitude in accordance with variations in gain of said stage; means connected with said amplifier for holding said stage inoperative until the input voltage to said amplifier rises to a predetermined value; means coupled to said thermionic amplifier for regulating the gain of said stage in accordance with the output level of said amplifier; a rectifier for rectifying said output signal; a load resistance connected in circuit with said rectifier for producing a direct control potential of negative polarity; and a control circuit connecting said load resistance to the grids of the thermionic tubes in said amplifier to apply said direct control potential thereto as a grid bias voltage.

WILLIAM J. O'BRIEN.

REFERENCES CITED

The following references are of record in the file of this patent:

UNITED STATES PATENTS

| Number | Name | Date |
|---|---|---|
| 2,065,489 | Etzrodt | Dec. 22, 1936 |
| 2,070,354 | Brand | Feb. 9, 1937 |
| 2,245,353 | Morlock | June 10, 1941 |
| 2,279,128 | Paslay | Apr. 7, 1942 |
| 2,316,474 | Van Slooten et al. | Apr. 13, 1943 |
| 2,333,081 | Beal | Nov. 2, 1943 |
| 2,409,139 | Magnuski | Oct. 8, 1946 |